(12) United States Patent
Chen

(10) Patent No.: US 11,637,159 B2
(45) Date of Patent: Apr. 25, 2023

(54) DISPLAY PANEL AND DISPLAY DEVICE WITH COMPLETED COVERED HOLLOWED REGIONS IN FRAME REGION

(71) Applicant: Xiamen Tianma Micro-Electronics Co., Ltd., Xiamen (CN)

(72) Inventor: Lindou Chen, Wuhan (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 87 days.

(21) Appl. No.: 17/209,431

(22) Filed: Mar. 23, 2021

(65) Prior Publication Data
US 2022/0216275 A1 Jul. 7, 2022

(30) Foreign Application Priority Data
Jan. 4, 2021 (CN) .......................... 202110003301.X

(51) Int. Cl.
*H01L 27/32* (2006.01)
*H01L 51/52* (2006.01)
(52) U.S. Cl.
CPC ...... *H01L 27/3246* (2013.01); *H01L 27/3258* (2013.01); *H01L 27/3279* (2013.01); *H01L 51/5215* (2013.01)
(58) Field of Classification Search
CPC ............. H01L 27/3246; H01L 27/3258; H01L 27/3279; H01L 51/5215

USPC .......................................................... 257/72
See application file for complete search history.

(56) References Cited

U.S. PATENT DOCUMENTS

2018/0366586 A1* 12/2018 Son ..................... H01L 29/7869
2019/0371876 A1* 12/2019 Kim .................... H01L 27/3246

FOREIGN PATENT DOCUMENTS

CN           109037282 A      12/2018

* cited by examiner

*Primary Examiner* — Xia L Cross
(74) *Attorney, Agent, or Firm* — Anova Law Group PLLC

(57) ABSTRACT

Display panel and display device are provided. The display panel includes a display region and a frame region surrounding the display region. In the frame region, the display panel includes a base substrate, a planarization layer, an anode layer and a pixel defining layer. The planarization layer includes a first region and a second region. The anode layer includes first hollowed regions and second hollowed regions. The first hollowed regions at least partially overlap the first region, and the second hollowed regions at least partially overlap the second region. The pixel defining layer includes first covering parts and second covering parts. The first covering parts cover the first hollowed regions and extend to cover edges of the anode layer. The second covering parts cover the second hollowed regions and extend to cover edges of the anode layer. Orthographic projections of the first covering parts on the base substrate are larger than orthographic projections of the second covering parts on the base substrate.

16 Claims, 18 Drawing Sheets

DISPLAY PANEL AND DISPLAY DEVICE WITH COMPLETED COVERED HOLLOWED REGIONS IN FRAME REGION

CROSS-REFERENCES TO RELATED APPLICATION

This application claims the priority of Chinese Patent Application No. 202110003301.X, filed on Jan. 4, 2021, the content of which is incorporated herein by reference in its entirety.

TECHNICAL FIELD

The present disclosure generally relates to the field of display technology and, more particularly, relates to a display panel and a display device.

BACKGROUND

Organic light Emitting diodes (OLEDs), especially active-matrix organic light emitting diodes (AMOLEDs), have the advantages of high brightness, full viewing angle, fast response speed and flexible display, and have been widely used in the display field.

An OLED display panel usually includes an array layer, a planarization layer on the array layer, an anode layer on the planarization layer, and a pixel defining layer on the anode layer. In existing technologies, because of material reasons, the planarization layer is prone to volatilization and outgassing when heated during subsequent processes of the anode layer and other manufacturing processes. Therefore, it is necessary to open the anode layer at a frame area of the array substrate to prevent the anode layer from blocking gas releasing of the planarization layer, to ensure the process yield of the display panel. The openings on the anode layer will be covered by covering parts distributed in an island shape formed by the pixel defining layer later. However, a case that the covering parts cannot completely cover the openings frequently appear, and the edge line of the anode layer at the openings is exposed.

SUMMARY

One aspect of the present disclosure provides a display panel. The display panel includes a display region and a frame region surrounding the display region. In the frame region, the display panel includes: a base substrate; a planarization layer at a side of the base substrate; an anode layer at a side of the planarization layer away from the base substrate; and a pixel defining layer at a side of the anode layer away from the base substrate. The planarization layer includes a first region and a second region. In the first region, a perpendicular distance from an upper surface of the planarization layer to an upper surface of the base substrate is a first distance. In the second region, a perpendicular distance from an upper surface of the planarization layer to an upper surface of the base substrate is a second distance. The first distance is larger than the second distance. The anode layer includes a plurality of first hollowed regions and a plurality of second hollowed regions; and along a direction perpendicular to a plane of the base substrate, the plurality of first hollowed regions at least partially overlaps the first region, and the plurality of second hollowed regions at least partially overlaps the second region. The pixel defining layer includes a plurality of first covering parts and a plurality of second covering parts which are discrete from each other. The plurality of first covering parts covers the plurality of first hollowed regions and extends to cover edges of the anode layer at the plurality of first hollowed regions. The plurality of second covering parts covers the plurality of second hollowed regions and extends to cover edges of the anode layer at the plurality of second hollowed regions. An area of orthographic projections of the plurality of first covering parts on the base substrate is larger than an area of orthographic projections of the plurality of second covering parts on the base substrate.

Another aspect of the present disclosure provides a display device. The display device includes a display panel. The display panel includes a display region and a frame region surrounding the display region. In the frame region, the display panel includes: a base substrate; a planarization layer at a side of the base substrate; an anode layer at a side of the planarization layer away from the base substrate; and a pixel defining layer at a side of the anode layer away from the base substrate. The planarization layer includes a first region and a second region. In the first region, a perpendicular distance from an upper surface of the planarization layer to an upper surface of the base substrate is a first distance. In the second region, a perpendicular distance from an upper surface of the planarization layer to an upper surface of the base substrate is a second distance. The first distance is larger than the second distance. The anode layer includes a plurality of first hollowed regions and a plurality of second hollowed regions; and along a direction perpendicular to a plane of the base substrate, the plurality of first hollowed regions at least partially overlaps the first region, and the plurality of second hollowed regions at least partially overlaps the second region. The pixel defining layer includes a plurality of first covering parts and a plurality of second covering parts which are discrete from each other. The plurality of first covering parts covers the plurality of first hollowed regions and extends to cover edges of the anode layer at the plurality of first hollowed regions. The plurality of second covering parts covers the plurality of second hollowed regions and extends to cover edges of the anode layer at the plurality of second hollowed regions. An area of orthographic projections of the plurality of first covering parts on the base substrate is larger than an area of orthographic projections of the plurality of second covering parts on the base substrate.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
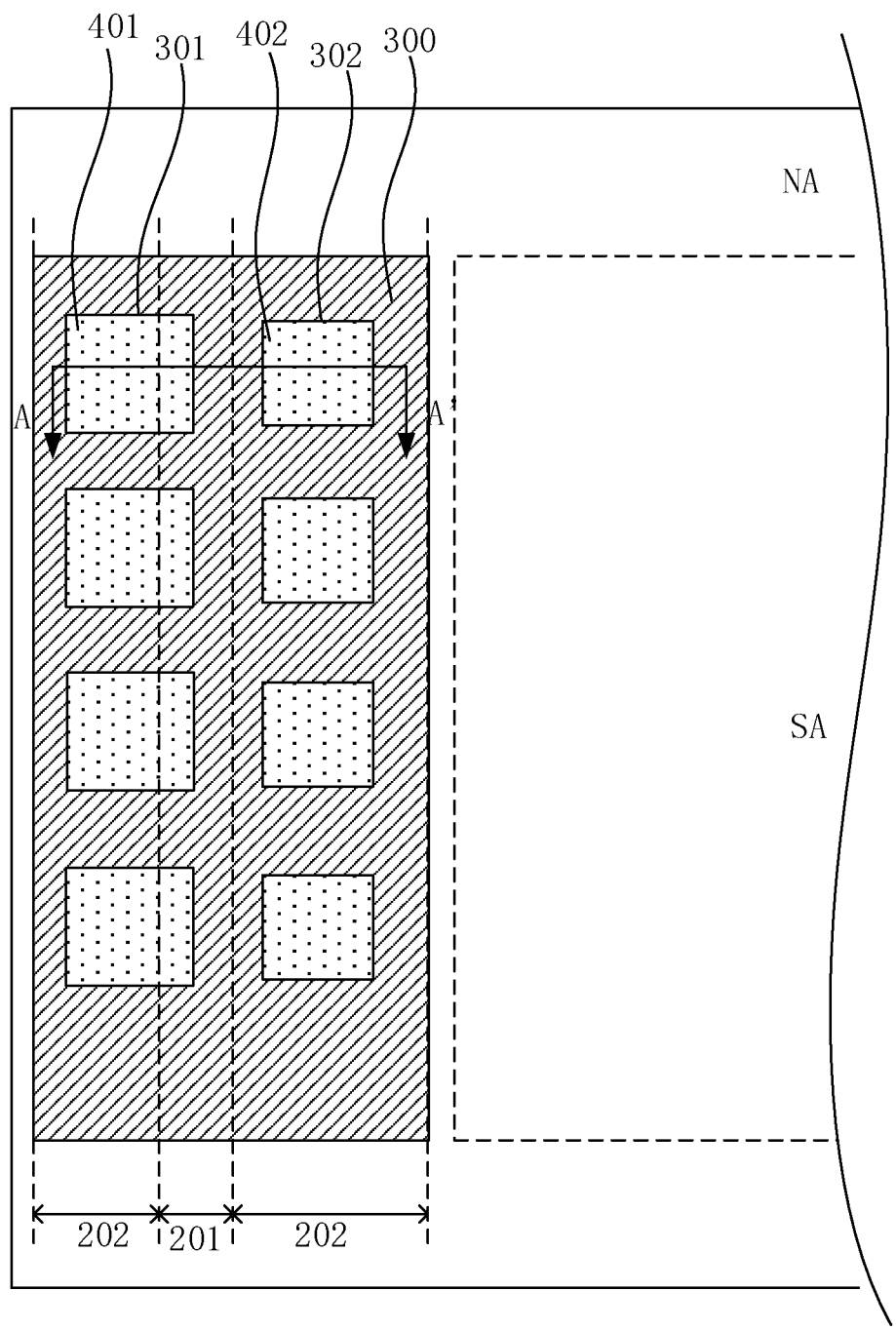
FIG. 1 illustrates an exemplary display panel consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width and depth should be considered during practical fabrication.

An OLED display panel usually includes an array layer, a planarization layer on the array layer, an anode layer on the planarization layer, and a pixel defining layer on the anode layer. In existing technologies, because of material reasons, the planarization layer is prone to volatilization and outgassing when heated during subsequent processes of the anode layer and other manufacturing processes. Therefore, it is necessary to form openings in the anode layer at a frame area of the array substrate to prevent the anode layer from blocking gas releasing of the planarization layer, to ensure the process yield of the display panel. The openings on the anode layer will be hemmed and covered by covering parts distributed in an island shape formed by the pixel defining layer later. However, a case that the covering parts cannot completely cover the openings frequently appears, and edge lines of the anode layer at the openings is exposed. Exposing of edge lines of the anode layer at the openings may induce the anode layer to be oxidized and fall off here. Further, in etching processes of the subsequent processes, the anode layer may be etched along edges of the openings, and lines in the array layer may be exposed.

The present disclosure provides a display panel and a display device, to alleviate above problems and ensure that first hollowed regions and second hollowed regions are completely covered by corresponding covering parts.

Figure 2:
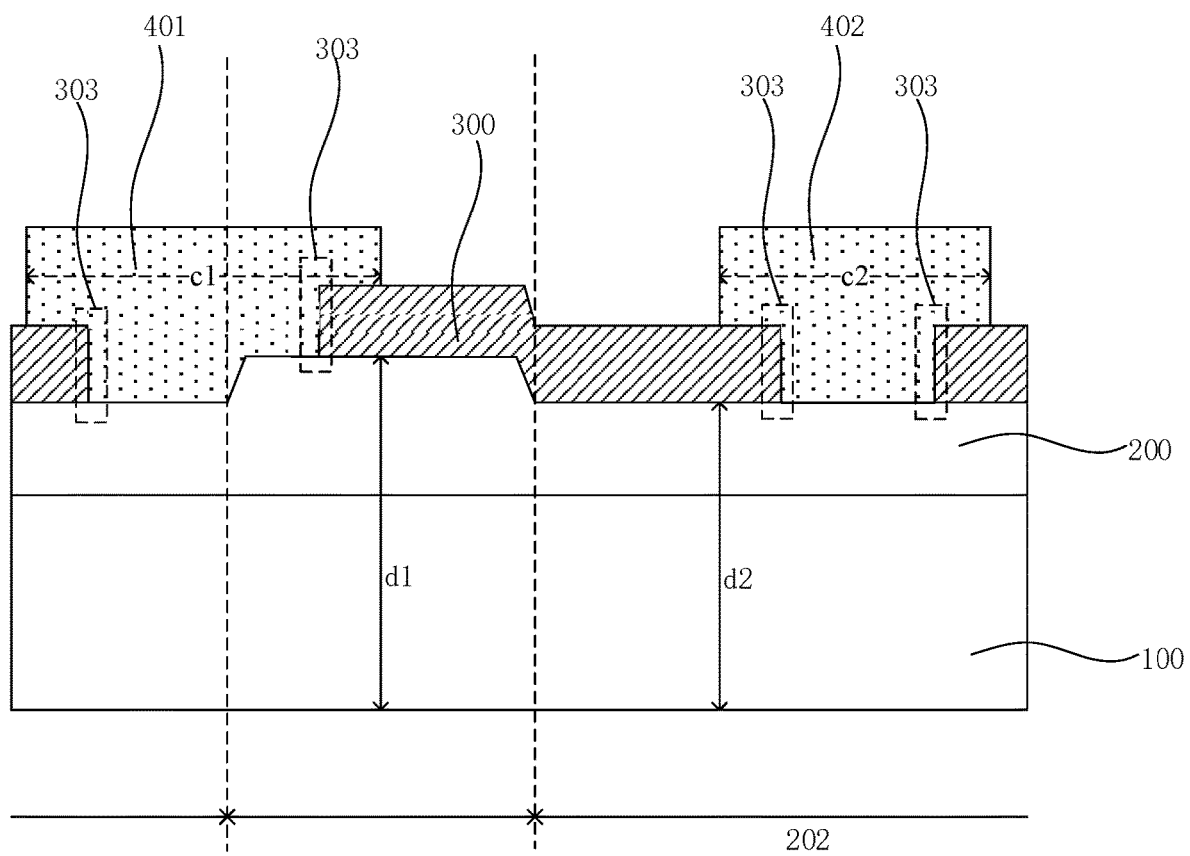
FIG. 2 illustrates a cross-section view along a A-A' direction in FIG. 1.

FIG. 1 illustrates an exemplary display panel consistent with various disclosed embodiments in the present disclosure; and FIG. 2 illustrates a cross-section view along a A-A' direction in FIG. 1. As illustrated in FIG. 1 and FIG. 2, the display panel may include a display region SA and a frame region NA surrounding the display region SA. In the frame region NA, the display panel may include a base substrate 100, a planarization layer 200 at one side of the substrate panel 100, an anode layer 300 at a side of the planarization layer 200 away from the substrate panel 100, and a pixel defining layer at a side of the anode layer 300 away from the base substrate 100.

The planarization layer 200 may include a first region 201 and a second region 202. In the first region 201, a perpendicular distance from an upper surface of the planarization layer 200 to an upper surface of the base substrate 100 may be a first distance d1. In the second region 202, a perpendicular distance from an upper surface of the planarization layer 200 to an upper surface of the base substrate 100 may be a second distance d2. The first distance d1 may be larger than the second distance d2.

The anode layer 300 may include a plurality of first hollowed regions 301 and a plurality of second hollowed regions 302. Along a direction perpendicular to a plane of the base substrate 100, the plurality of first hollowed regions 301 may at least partially overlap the first region 201, and the plurality of second hollowed regions 302 may at least partially overlap the second region 202.

The pixel defining layer may include a plurality of first covering parts 401 isolated from each other and a plurality of second covering parts 402 isolated from each other. The plurality of first covering parts 401 may cover the plurality of first hollowed regions 301 and may extend to cover edges of the anode layer 300 at the plurality of first hollowed regions 301. The plurality of second covering parts 402 may cover the plurality of second hollowed regions 302 and may extend to cover edges of the anode layer 300 at the plurality of second hollowed regions 302. An area of orthographic projections of the plurality of first covering parts 401 on the base substrate 100 may be larger than an area of orthographic projections of the plurality of second covering parts 402 on the base substrate 100, as shown in FIG. 2. In one embodiment, a width c1 of the plurality of first covering parts 401 may be configured to be larger than a width c2 of the plurality of second covering parts 402, to make the area of the orthographic projections of the plurality of first covering parts 401 on the base substrate 100 larger than the area of the orthographic projections of the plurality of second covering parts 402 on the base substrate 100.

In one embodiment, as illustrated in FIG. 1, an area of the plurality of first hollowed regions 301 may be larger than an area of the plurality of second hollowed regions 302. In one embodiment, the plurality of first hollowed regions 301 and the plurality of second hollowed regions 302 may have rectangular shape. For description purposes only, the embodiment in FIG. 1 where the plurality of first hollowed regions 301 and the plurality of second hollowed regions 302 have rectangular shape is used as an example to illustrate the present disclosure, and should not limit the scopes of the present disclosure. In various embodiments, the plurality of first hollowed regions 301 and the plurality of second hollowed regions 302 may have any suitable shape.

In the present disclosure, the upper surface of the planarization layer may be a side surface of the planarization layer away from the base substrate, and the upper surface of the base substrate may be a side surface of the base substrate toward the planarization layer. The upper surface of the base substrate corresponding to the first region and the second region may be in a same plane. The perpendicular distance from the upper surface of the planarization layer 200 in the first region to the upper surface of the base substrate 100 may be larger than the perpendicular distance from the upper surface of the planarization layer 200 in the second region to the upper surface of the base substrate 100. That is, at the side surface of the planarization layer away from the base substrate, the upper surface of the planarization layer 200 in the first region may be convex compared to the upper surface of the planarization layer 200 in the second region.

Figure 3:
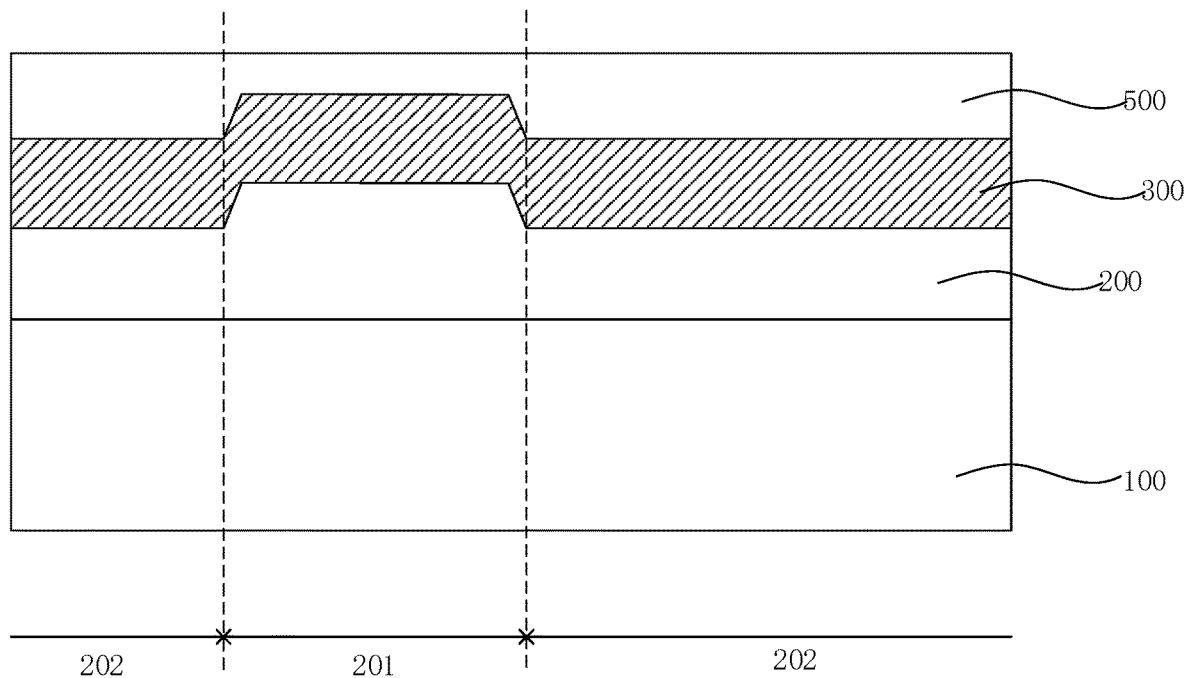
FIG. 3 illustrates an exemplary anode layer for photolithography process consistent with various disclosed embodiments in the present disclosure.
Figure 4:
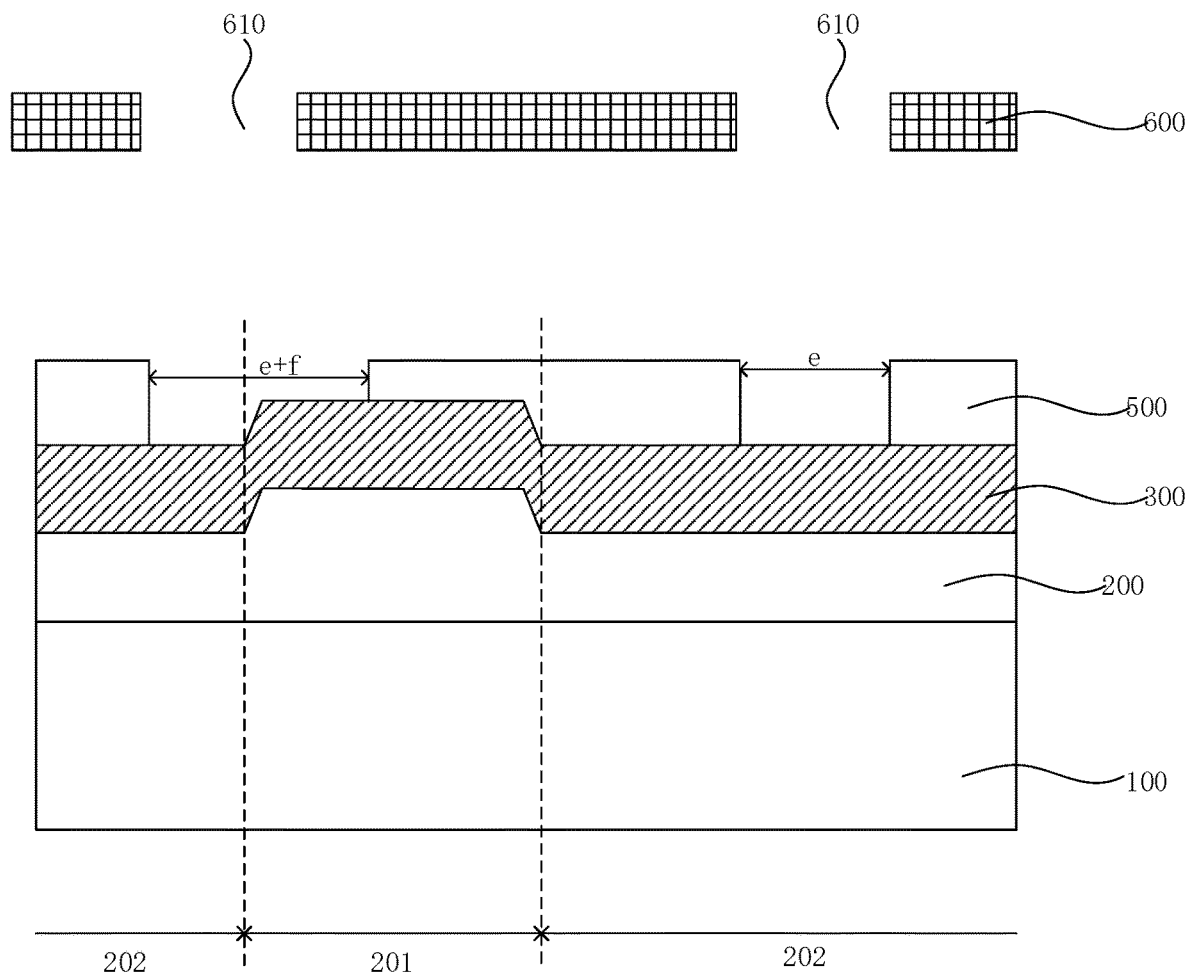
FIG. 4 illustrates another exemplary anode layer for photolithography process consistent with various disclosed embodiments in the present disclosure.
Figure 5:
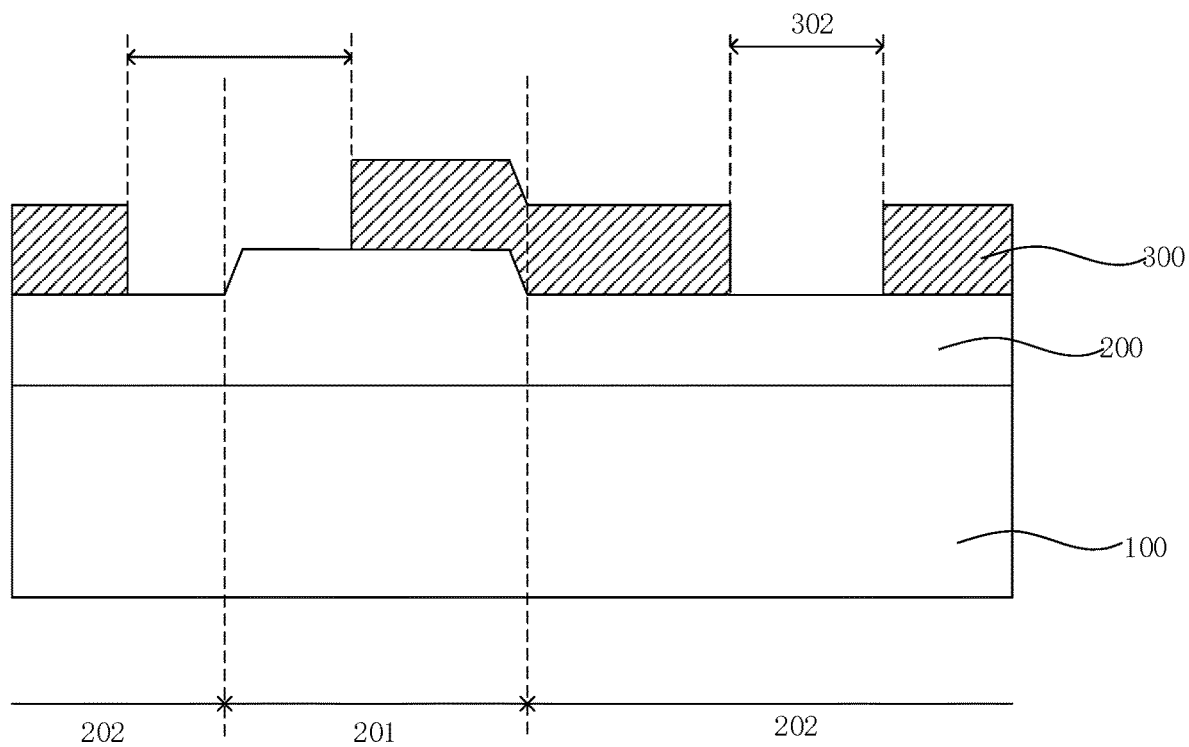
FIG. 5 illustrates another exemplary anode layer for photolithography process consistent with various disclosed embodiments in the present disclosure.

FIGS. 3-5 illustrate exemplary anode layers for photolithography process consistent with various disclosed embodiments in the present disclosure. In the present disclosure, the anode layer 300 may be disposed at the side of the planarization layer 200 away from the base substrate 100. The side surface of the planarization layer 200 away from the base substrate 100 may not be completely flat, and the upper surface of the planarization layer 200 in the first region may be convex compared to the upper surface of the planarization layer 200 in the second region. Correspondingly, when the anode layer 300 may be disposed at the side of the planarization layer 200 away from the base substrate 100, a portion of the anode layer 300 at the upper surface of the planarization layer 200 in the first region may be convex compared to another portion of the anode layer 300 at the upper surface of the planarization layer 200 in the second region. As illustrated in FIG. 3, when using a photolithograph process to form the plurality of first hollowed regions 301 and the plurality of second hollowed regions 302, a photoresist layer 500 may be formed at the anode layer 300 first. Because of the strong fluidity of the photoresist layer 500, a side surface of the photoresist layer 500 away from the base substrate 100 may be relatively flat, such that a thickness of a portion of the photoresist layer 500 corresponding to the anode layer 300 in the first region 201 may be smaller.

Subsequently, as illustrated in FIG. 4, a mask 600 may be used to expose and develop regions corresponding to the plurality of first hollowed regions 301 and the regions corresponding to the plurality of second hollowed regions 302. Since in the mask 600 used, openings 610 at positions corresponding to the plurality of first hollowed regions 301 and openings 610 at positions corresponding to the plurality of second hollowed regions 302 may have same size, such that the thinner part of the photoresist layer 500 at the first region 201 may be overexposed. For example, at the openings 610 of the mask 600 overlapping the first region 201, a width of hollows formed by development after exposure of the photoresist layer 500 may be e+f; and at the openings 610 of the mask 600 overlapping the second region 202, a width of hollows formed by development after exposure of the photoresist layer 500 may be e.

Then, as illustrated in FIG. 5, the anode layer 300 may be etched by using the photoresist layer 500 as a mask, to form the plurality of first hollowed regions 301 and the plurality of second hollowed regions 302. The plurality of first hollowed regions 301 may be regions in the anode layer 300 that are prone to be over etched, and correspondingly an etch area of the plurality of first hollowed regions 301 may be larger than an etch area of the plurality of second hollowed regions 302. Correspondingly, when using covering parts with same size to cover the plurality of first hollowed regions 301 and the plurality of second hollowed regions 302, the plurality of first hollowed regions 301 may not be completely covered and edge wires in the anode layer at the plurality of first hollowed regions 301 may be exposed. In the present disclosure, the first covering parts with larger size may be used to cover the plurality of first hollowed regions 301, to ensure that the first covering parts completely cover the plurality of first hollowed regions 301 and extend to cover edge areas of the anode layer at the plurality of first hollowed regions 301.

In the present disclosure, the first covering parts with size larger than the second covering parts may be used to cover the plurality of first hollowed regions 301, to ensure that the first covering parts completely cover the plurality of first hollowed regions 301 that is over etched and cover the edge areas of the anode layer at the plurality of first hollowed regions 301. Correspondingly, it may be ensured that the plurality of first hollowed regions 301 and the plurality of second hollowed regions 302 in the anode layer 300 are completely covered, to prevent the edge wires of the anode layer at the plurality of first hollowed regions 301 and the plurality of second hollowed regions 302 from being exposed. As illustrated in FIG. 2, the first covering parts 401 and the second covering parts 402 may cover edge wires 303 of the anode layer 300 at the hollowed regions, to prevent a portion of the anode layer at these positions from being oxidized and falling off. Correspondingly, in the subsequent processes, the portion of the anode layer at these positions may also be prevented from being etched to expose wires in the array layer.

Figure 6:
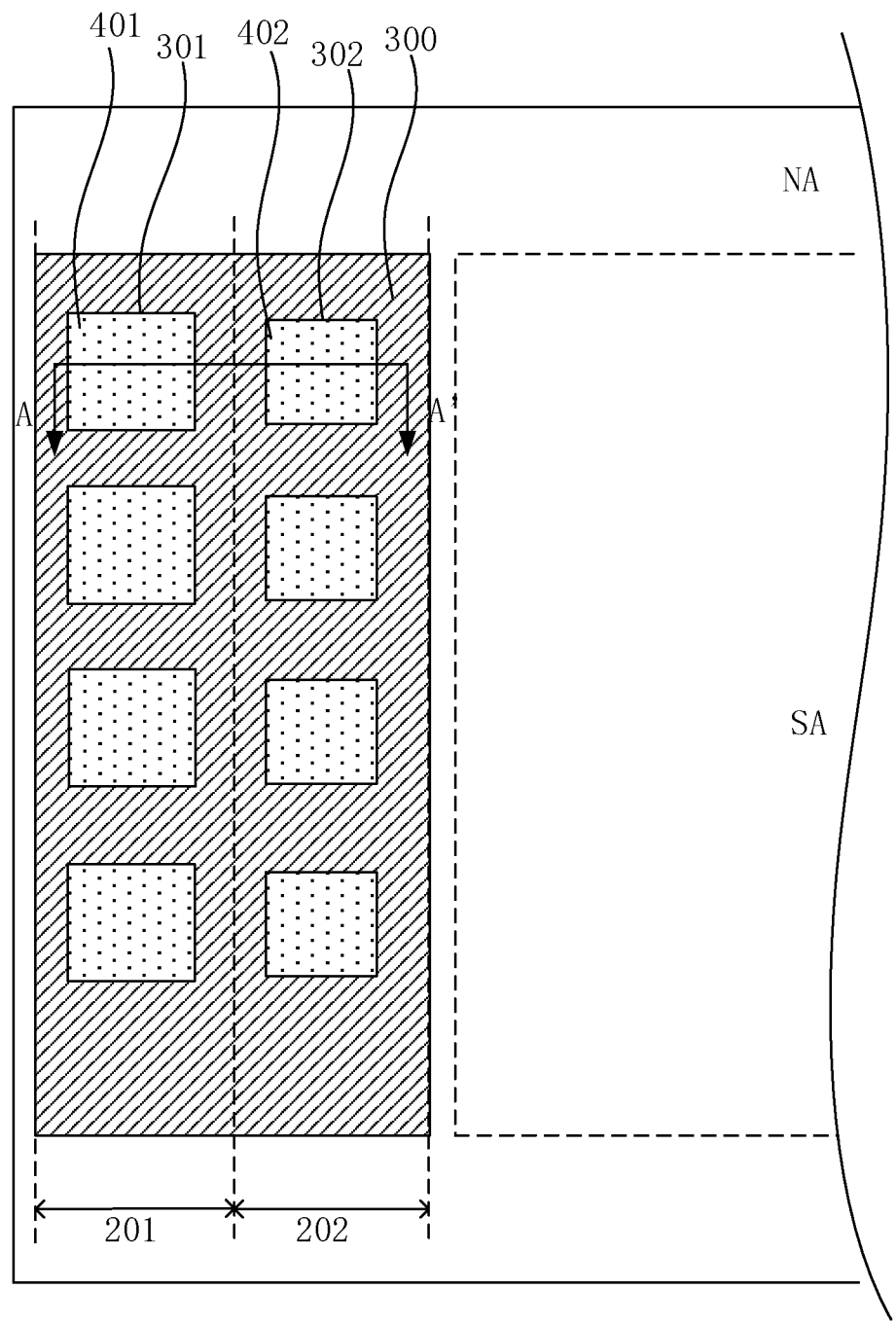
FIG. 6 illustrates another exemplary display panel consistent with various disclosed embodiments in the present disclosure.
Figure 7:
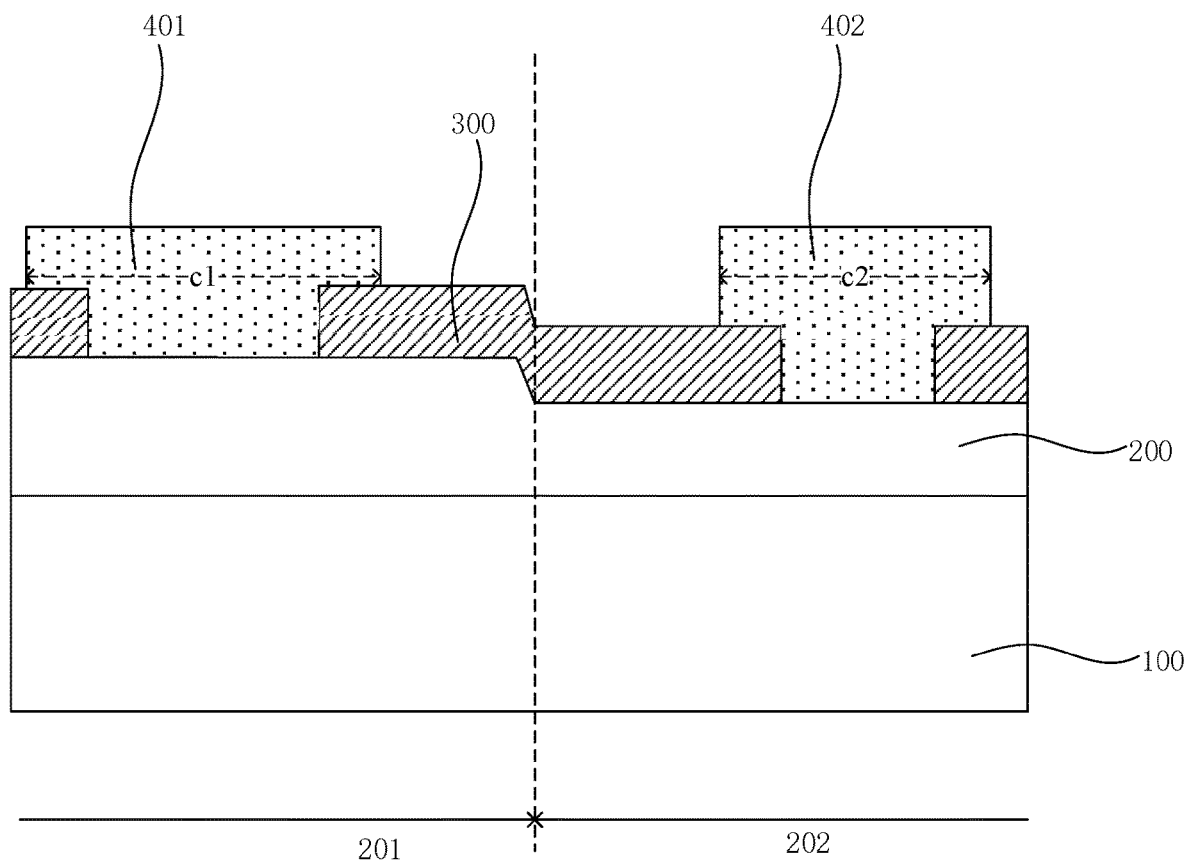
FIG. 7 illustrates a cross-section view along an A-A' direction in FIG. 6 consistent with various disclosed embodiments in the present disclosure.

In one embodiment, the plurality of first hollowed regions may partially overlap the first region. In some other embodiments, the plurality of first hollowed regions may overlap the first region as a whole. The present disclosure has no limit on this. In one embodiment as illustrated in FIG. 6 showing an exemplary display panel and FIG. 7 which is a cross-section view along the A-A' direction in FIG. 6, the anode layer 300 may include the plurality of first hollowed regions 301 and the plurality of second hollowed regions 302. Along the direction perpendicular to the plane of the base substrate 100, the plurality of first hollowed regions 301 may overlap the first region 201 as a whole, and the plurality of second hollowed regions 302 may at least partially overlap the second region 202. The plurality of first covering parts 401 may cover the plurality of first hollowed regions 301 and may extend to cover the edges of the anode layer 300 at the plurality of first hollowed regions 301. The plurality of second covering parts 402 may cover the plurality of second hollowed regions 302 and may extend to cover the edges of the anode layer 300 at the plurality of second hollowed regions 302. The area of the orthographic projections of the plurality of first covering parts 401 on the base substrate 100 may be larger than the area of the orthographic projections of the plurality of second covering parts 402 on the base substrate 100. As illustrated in FIG. 7, in one embodiment, a width c1 of the plurality of first covering parts 401 may be configured to be larger than a width c2 of the plurality of second covering parts 402, to make the area of the orthographic projections of the plurality of first covering parts 401 on the base substrate 100 larger than the area of the orthographic projections of the plurality of second covering parts 402 on the base substrate 100.

The display panel may include the plurality of first hollowed regions. Correspondingly, in one embodiment, each first hollowed region of the plurality of first hollowed regions may partially overlap the first region. In some other embodiments, each first hollowed region of the plurality of first hollowed regions may overlap the first region as a whole. In some other embodiments, a portion of the plurality of first hollowed regions may partially overlap the first region, and a remaining portion of the plurality of first hollowed regions may overlap the first region as a whole. The present disclosure has no limits on this.

Figure 8:
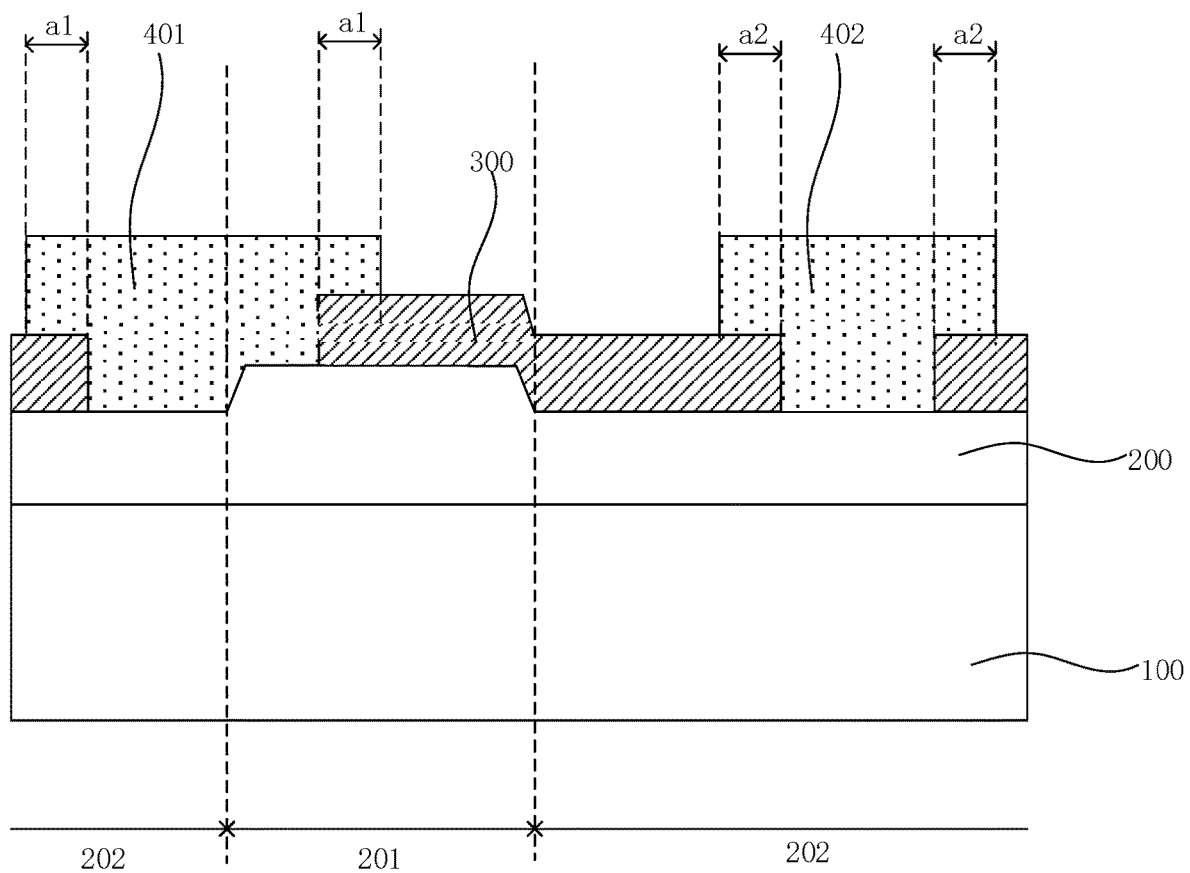
FIG. 8 illustrates another exemplary display panel consistent with various disclosed embodiments in the present disclosure.

In one embodiment illustrated in FIG. 8 showing an exemplary display panel provided by the present disclosure, an edge covering width that the plurality of first covering parts 401 covers the edges of the anode layer 300 may be a1, and an edge covering width that the plurality of second covering parts 402 covers the edges of the anode layer 300 may be a2. In one embodiment, a1≥a2

In the present disclosure, the area of the plurality of first hollowed regions may be larger than the area of the plurality of second hollowed regions. Edge covering width of the plurality of first covering parts covers the edges of the anode layer at different side edges of the plurality of first hollowed regions may be same, and edge covering width of the plurality of second covering parts covers the edges of the anode layer at different side edges of the plurality of second hollowed regions may be same. Correspondingly, when the edge covering width that the plurality of first covering parts covers the edges of the anode layer at the edges of the plurality of first hollowed regions is same as the edge covering width that the plurality of second covering parts covers the edges of the anode layer at the edges of the plurality of second hollowed regions, the area of the orthographic projections of the plurality of first covering parts on the base substrate may be guaranteed to be larger than the area of the orthographic projections of the plurality of second covering parts on the base substrate. Correspondingly, it may be ensured that the plurality of first hollowed regions and the plurality of second hollowed regions in the anode layer are completely covered by the corresponding covering parts, to prevent the edge wires from being exposed at the plurality of first hollowed regions and the plurality of second hollowed regions in the anode layer.

In some embodiments, the edge covering width that the plurality of first covering parts covers the edges of the anode layer at the edges of the plurality of first hollowed regions may be larger than the edge covering width that the plurality of second covering parts covers the edges of the anode layer at the edges of the plurality of second hollowed regions. Correspondingly, in addition to ensure that the plurality of first hollowed regions and the plurality of second hollowed regions in the anode layer are completely covered by the corresponding covering parts, the plurality of first covering parts may be guaranteed to cover the edges of the anode layer at the plurality of first hollowed regions more, to prevent an etch extension pattern generated by the anode layer being over etched from not being covered. In one embodiment, the edge covering width a1 and the edge covering width a2 may have a relationship of 0≤a1−a2≤3 μm. The embodiment where the edge covering width a1 and the edge covering width a2 may have a relationship of 0≤a1−a2≤3 μm is used as an example to illustrate the present disclosure, and should not limit the scopes of the present disclosure. In various embodiments, the edge covering width a1 and the edge covering width a2 may have any suitable relationship.

In one embodiment, the edge covering width a1 that the plurality of first covering parts covers the edges of the anode layer at the edges of the plurality of first hollowed regions may be 1 μm≤a1≤5 μm. In various embodiments, the edge covering width a1 may be configured to any appropriate value and the present disclosure has no limit on this.

Figure 9:
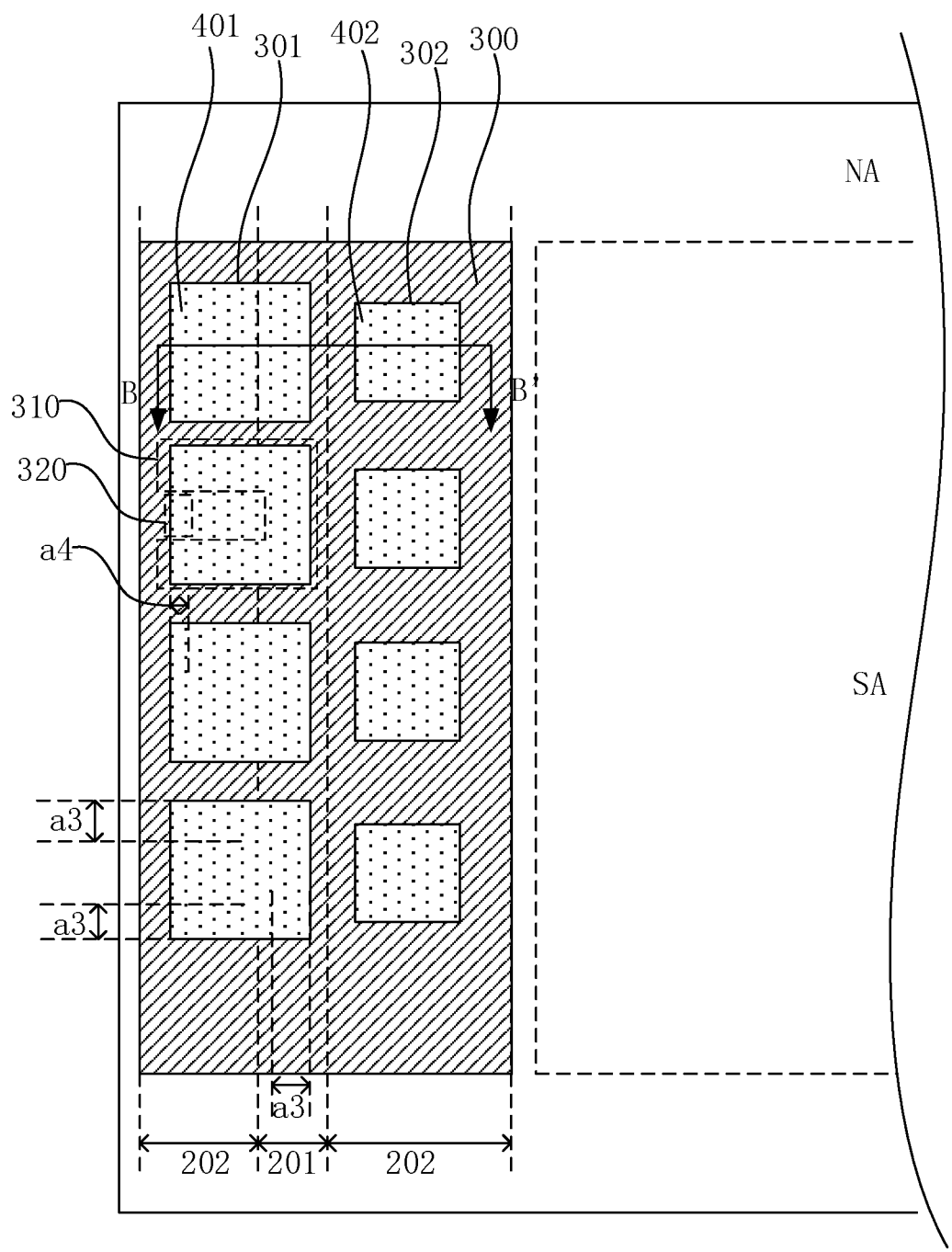
FIG. 9 illustrates another exemplary display panel consistent with various disclosed embodiments in the present disclosure.
Figure 10:
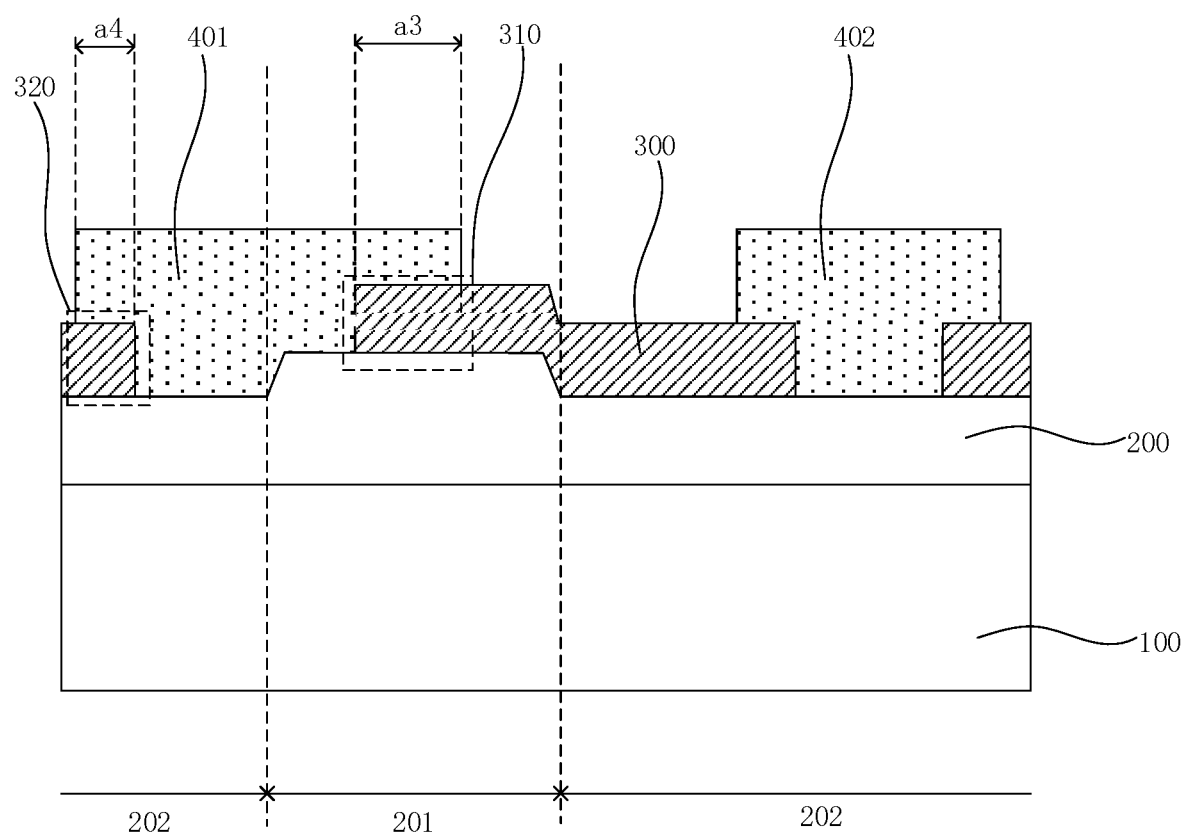
FIG. 10 illustrates a cross-section view along a B-B' direction in FIG. 6 consistent with various disclosed embodiments in the present disclosure.

In one embodiment as illustrated in FIG. 9 showing an exemplary display panel and FIG. 10 which is a cross-section view along the B-B' direction in FIG. 10, an edge area of the anode layer 300 close to each of the plurality of first hollowed regions 301 and covered by a corresponding one of the plurality of first covering parts 401 may include a first edge region 310 and a second edge region 320. Along the direction perpendicular to the plane of the base substrate 100, the first edge region 310 may overlap the first region 201 and the second edge region 320 may overlap the second region 202. A width a3 of the first edge region 310 may be larger than a width a4 of the second edge region 320. In one embodiment, the width a3 of the first edge region 310 and the width a4 of the second edge region 320 may have a relationship of 0≤a3−a4≤3 μm. The present disclosure has no limit on this.

In the present disclosure, the area of the plurality of first hollowed regions may be larger than the area of the plurality of second hollowed regions. The edge covering width of each of the plurality of first covering parts covering the anode layer at different side edges of a corresponding one of the plurality of first hollowed regions may be different, while the edge covering width of each of the plurality of second covering parts covering the anode layer at different side edges of a corresponding one of the plurality of second hollowed regions may be same. That is, when the plurality of first hollowed regions partially overlap the first region, the side edges of the anode layer at positions corresponding to where the plurality of first hollowed regions partially overlaps the first region may be prone to be over etched. By making the edge covering width of each of the plurality of first covering parts covering the anode layer where the plurality of first hollowed regions partially overlaps the first region larger, the etch extension pattern at the anode layer being over etched may be covered. That is, an edge area of the anode layer close to each of the plurality of first hollowed regions and covered by a corresponding one of the plurality of first covering parts may include a first edge region and a second edge region, and the width of the first edge region overlapping the first region may be configured to be larger than the width of the second edge region not overlapping the first region, to prevent the etch extension pattern at the anode layer being over etched from not being covered.

In some embodiments, the width of the second edge region may be larger than the edge covering width of the plurality of second covering parts covering the edges of the anode layer at the plurality of second hollowed regions. The present disclosure has no limit on this.

Figure 11:
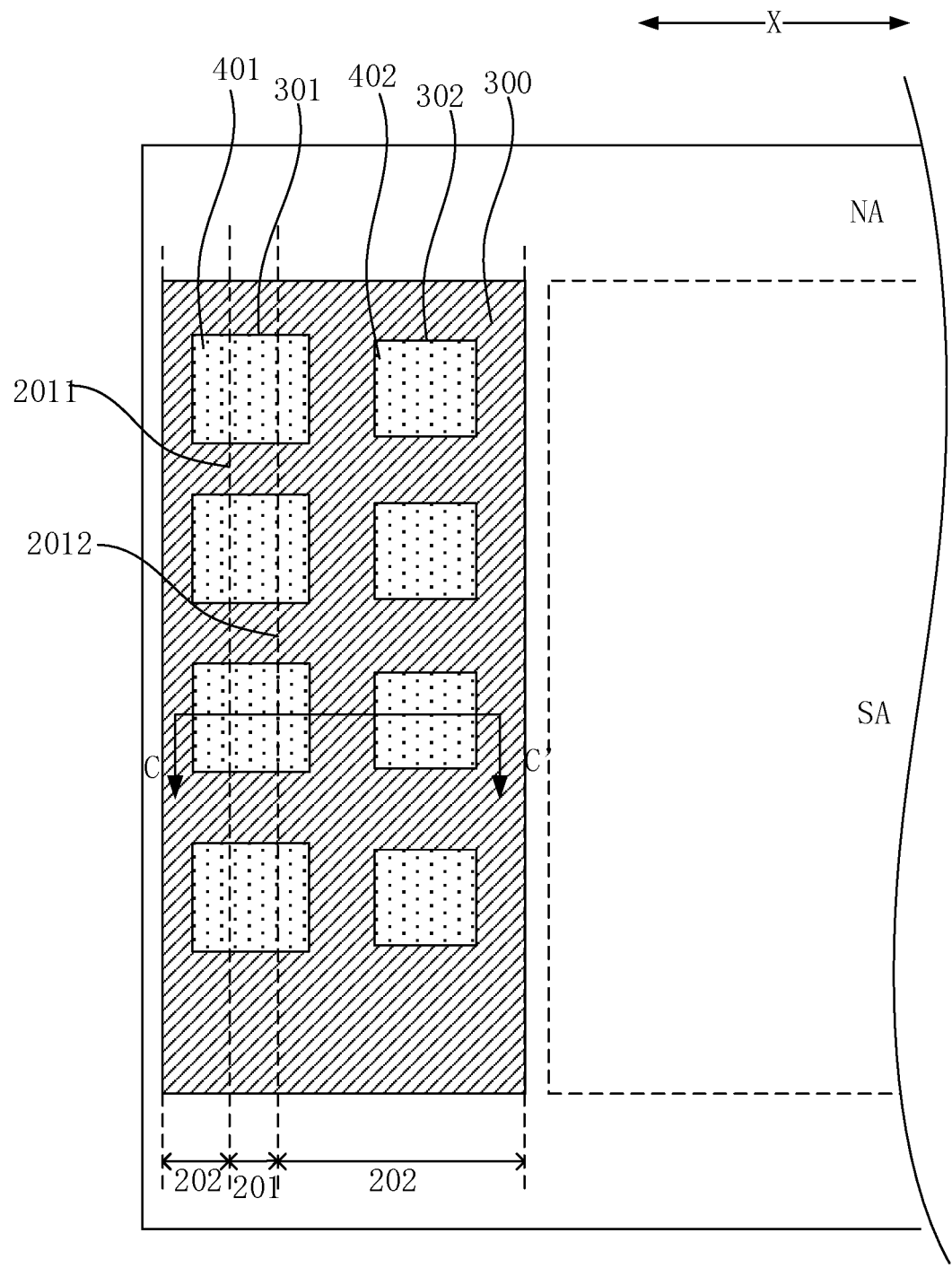
FIG. 11 illustrates another exemplary display panel consistent with various disclosed embodiments in the present disclosure.
Figure 12:
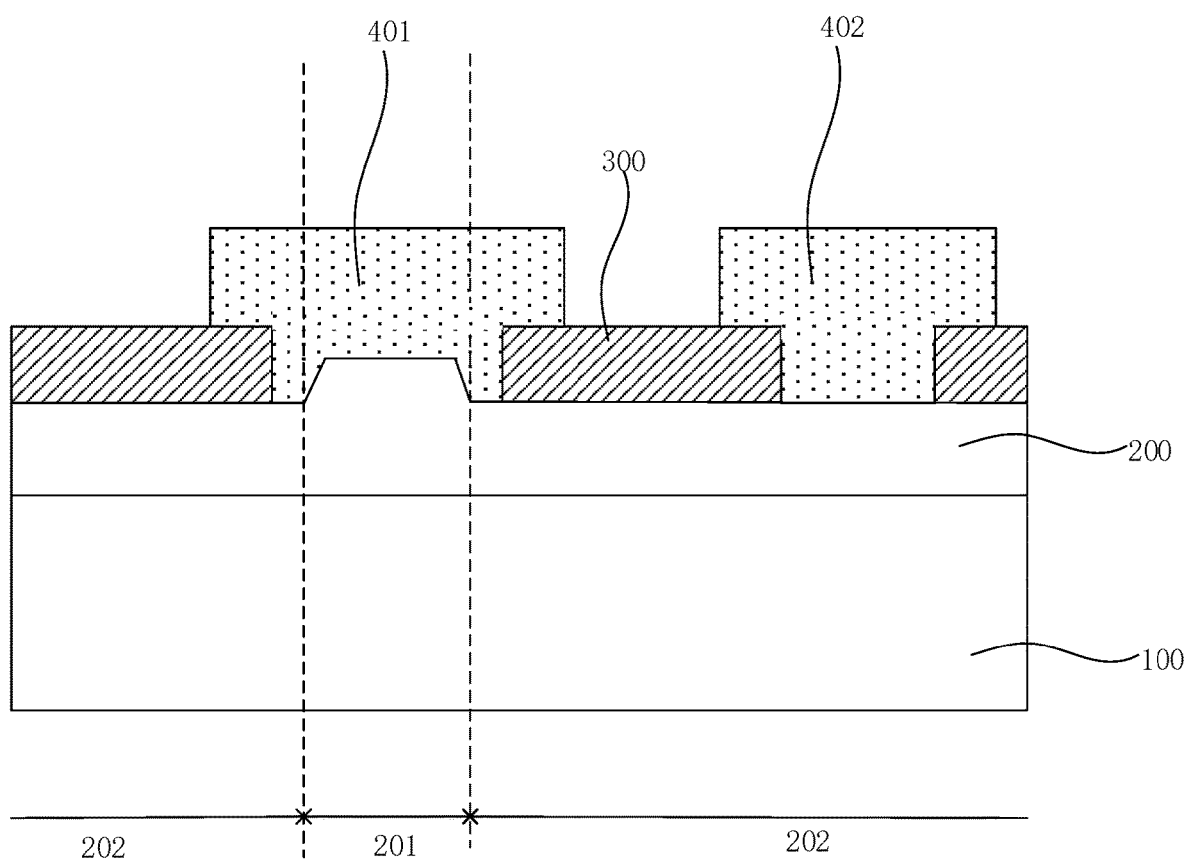
FIG. 12 illustrates a cross-section view along a C-C' direction in FIG. 11 consistent with various disclosed embodiments in the present disclosure.

In one embodiment as illustrated in FIG. 11 showing an exemplary display panel and FIG. 12 which is a cross-section view along the C-C' direction in FIG. 11, the first region 201 may include a first side edge 2011 and a second side edge 2012 disposed oppositely along a first direction X. Along the direction perpendicular to the plane of the base substrate, the orthographic projections of the plurality of first hollowed regions 301 may completely cover the first side edge 2011 and the second side edge 2012.

In the present disclosure, the plurality of first hollowed regions may overlap the first region. The orthographic projections of the plurality of first hollowed regions on the base substrate may be configured to completely cover the first side edge and the second side edge of the first region. Correspondingly, edge parts of the anode layer at the plurality of first hollowed regions may not be over etched, to reduce an amount of edges of the anode layer at the hollowed regions that are over etched. In one embodiment, the first direction may be an extending direction of gate wires in the display panel. The present disclosure has no limit on this.

In one embodiment, a portion of the surface of the planarization layer in the first region may be convex with respect to another portion of the surface of the planarization layer in in the second region, and may be formed by stacking a plurality of metal layers. As illustrated in FIG. 7 showing another exemplary display panel according to various embodiments of the present disclosure, the display panel may include the array layer between the base substrate 100 and the planarization layer 200. The array layer may include: a semiconductor layer 510 on the base substrate 100, a gate insulating layer 520 on a side of the semiconductor layer 510 away from the base substrate 100, a first metal layer 530 on a side of the gate insulating layer 520 away from the base substrate 100, an interlayer dielectric layer 540 on a side of the first metal layer 530 away from the base substrate 100, a second metal layer 550 on a side of the interlayer dielectric layer 540 away from the base substrate 100, a passivation layer 560 on a side of the second metal layer 550 away from the base substrate 100, and a third metal layer 570 on a side of the passivation layer 560 away from the base substrate 100. The second metal layer 550 and the third metal layer 570 may overlap with each other in the first region 201.

Figure 13:
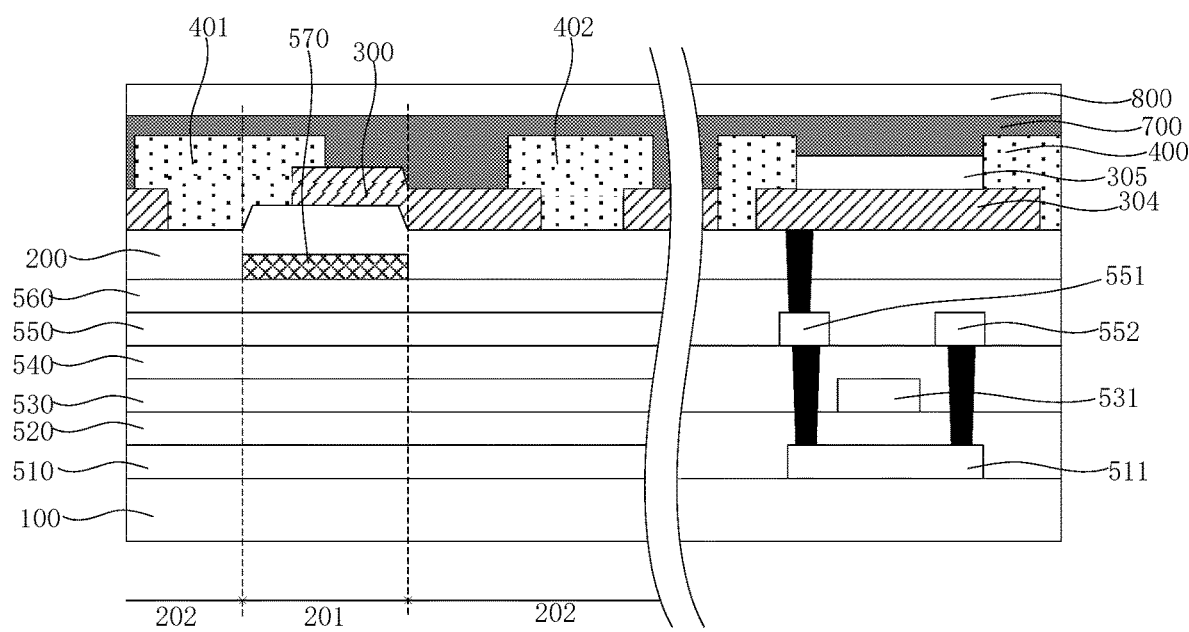
FIG. 13 illustrates another exemplary display panel consistent with various disclosed embodiments in the present disclosure.

As illustrated in FIG. 13, a transistor array may be provided in the array layer. Source layers 511 of transistors in the transistor array may be formed in the semiconductor layer 510. Gate electrodes 531 of the transistors may be formed in the first metal layer 530. Source electrodes 551 and drain electrodes 552 of the transistors may be formed in the second metal layer 550, and may be connected to the source layers 511 by through holes. In one embodiment, the planarization layer 200 may be disposed on a side of the third metal layer 570 away from the base substrate 100. The anode layer 300 may be disposed on the side of the planarization layer 200 away from the base substrate 100. The anode layer 300 may be provided with a plurality of anode blocks 304 in the display region. One of the plurality of anode blocks 304 may be connected to a corresponding transistor by a corresponding through hole. The pixel defining layer 400 may be disposed on the side of the anode layer 300 away from the base substrate 100. The pixel defining layer 400 may include a plurality of openings in the display region to define positions of light-emitting devices. The plurality of openings and the plurality of anode blocks may have a one-to-one correspondence. A light-emitting layer 305 may be formed in each of the plurality of openings and at a side of a corresponding one of the plurality of anode blocks 304 away from the base substrate 100. A cathode layer 700 may be formed at a side of light-emitting layers 305 and the pixel defining layer 400 away from the base substrate 100. One of the plurality of anode blocks 304, a corresponding light-emitting layer, and the cathode layer 700 may form a light-emitting device. The cathode layer 700 may be an entire layer structure, and the cathode layer 700 may be in contact with the exposed surface of the anode layer 300 in the edge area. A package layer 800 may be formed on a side of the cathode layer 700 away from the base substrate 100 and may be use a structure in existing technologies.

Wires in the frame area of the display panel are dense, making the width of the frame area wider. Therefore, in the present disclosure, the third metal layer may be provided in the frame area, and a part of the signal wires in the wires at the frame area may be disposed on the third metal layer. Correspondingly, the number of signal wires in other metal layers may be reduced, and the width of the frame area may be reduced. When the signal wires at the frame area include sections where the second metal layer and the third metal layer overlap, or when the signal wires located on the second metal layer and the signal wires located on the third metal layer have overlapping areas, the thickness of these areas becomes larger because the second metal layer and the third metal layer overlap, such that a part of the planarization layer at a position corresponding to the overlap between the second metal layer and the third metal layer protrudes. Further, when the planarization layer is formed on the side of the third metal layer away from the base substrate, the upper surface of the planarization layer corresponding to the overlap between the second metal layer and the third metal layer may protrude. That is, the overlap between the second metal layer and the third metal layer may be located at a position corresponding to the first region. Also, the side edges of the anode layer corresponding to the overlap between the plurality of first hollowed region and the first region provided may be prone to be over etched. Therefore, the present disclosure may use the plurality of first covering parts with a lager size to cover the plurality of first hollowed regions, to ensure that the plurality of first covering parts can completely cover the plurality of first hollowed regions and extend to cover the edges of the anode layer at the plurality of first hollowed regions.

Figure 14:
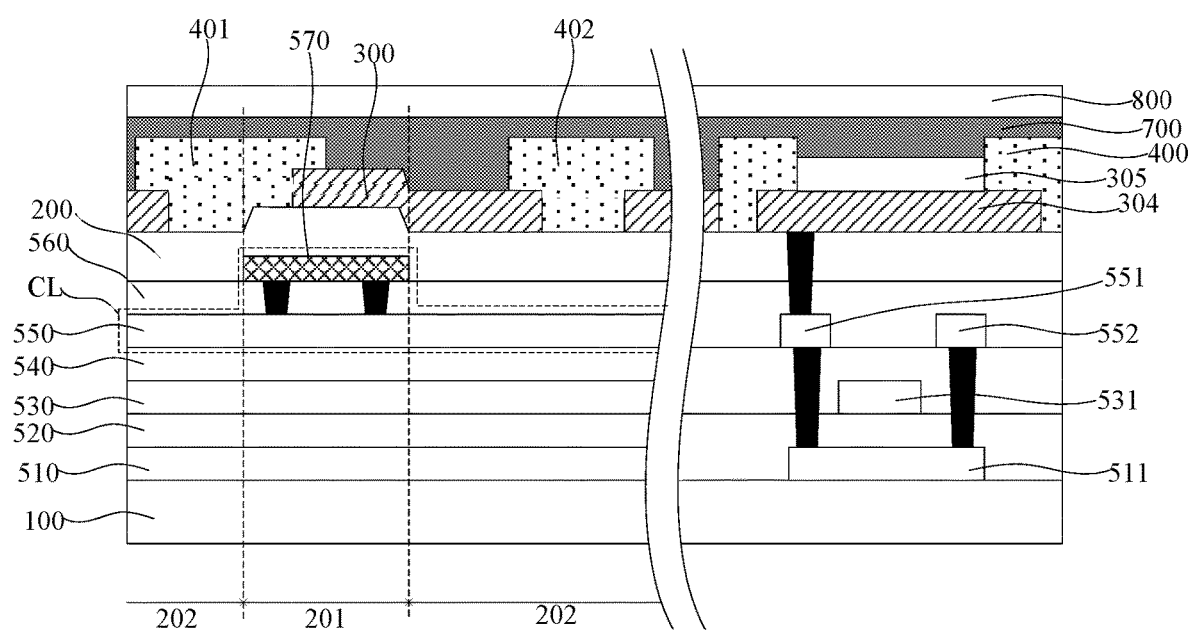
FIG. 14 illustrates another exemplary display panel consistent with various disclosed embodiments in the present disclosure.

In one embodiment illustrated in FIG. 14 showing another exemplary display panel, the frame area of the display panel may include a driving circuit (not shown in the figures) disposed in the array layer. The driving circuit may include a plurality of driving signal lines (CL). Along the direction perpendicular to the plane of the base substrate, a thickness of the plurality of driving signal lines in the first region may be larger than a thickness of the plurality of driving signal lines in the second region.

In the present disclosure, the plurality of driving signal lines in the first region 201 may include segments formed by overlapping between segments at the second metal layers 550 and segments at the third metal layer 570. The plurality of driving signal lines in the second region 202 may only include segments at the third metal layer 570. In the first region 201, the segments at the second metal layers 550 and segments at the third metal layer 570 may be electrically connected and stacked through a plurality of through holes. The thickness of the plurality of driving signal lines in the first region may be configured to be larger than the thickness of the plurality of driving signal lines in the second region. Compared to single-layer lines with a smaller thickness, resistance of the plurality of driving signal lines may be reduced and signal transmission performance of the plurality of driving signal lines may be improved. In various embodiments, the plurality of driving signal lines may include signal lines for connecting the driving circuit at the frame area and pixel circuits in the display region, or reference voltage signal lines. The present disclosure has no limit on this.

For description purposes only, the plurality of driving signal lines in the embodiment shown in FIG. 14 is only used as an example to illustrate an interlayer relationship between lines that the plurality of driving signal lines may include the segments formed by overlapping between segments at the second metal layers 550 and segments at the third metal layer 570 and the segments only at a single metal layer. The present disclosure has no limit on parameters of the plurality of driving signal lines including the extending directions or length. These parameters may be configured according to actual needs.

Figure 15:
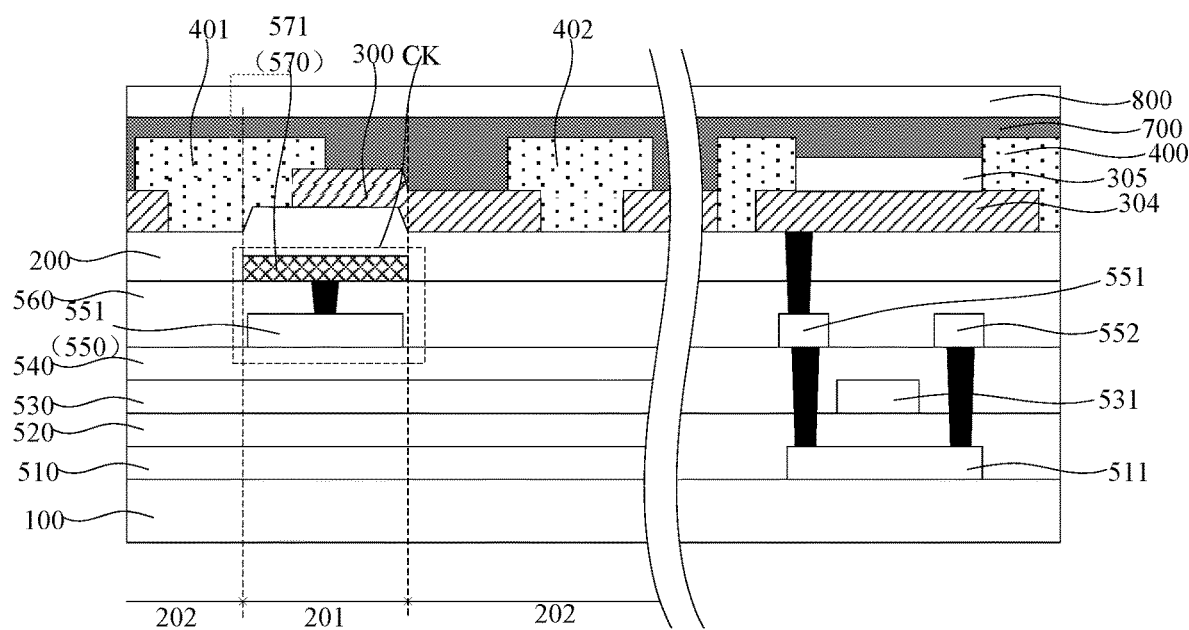
FIG. 15 illustrates another exemplary display panel consistent with various disclosed embodiments in the present disclosure.

In one embodiment illustrated in FIG. 15 showing another exemplary display panel, the frame area of the display panel may include clock signal lines (CK) in the first region 201. The clock signal lines may include first clock lines 551 disposed in the second metal layer 550 and second clock lines 571 disposed the third metal layer 570. The first clock lines 551 and the second clock lines 571 may be configured in parallel.

In the present disclosure, the clock signal lines in the display panel may include the first clock lines 551 and the second clock lines 571. The first clock lines 551 and the second clock lines 571 may be configured in parallel, and may overlap with each other along a direction perpendicular to the display panel. The first clock lines 551 and the second clock lines 571 may extend along a second direction. The second direction may be an extending direction of data lines of the display panel, and an extending direction of the gate lines of the display panel may be perpendicular to the extending direction of data lines of the display panel. Compared to single-layer clock signal lines, the clock signal lines configured in parallel may reduce resistance of the clock signal lines and improve the signal transmission performance of the clock signal lines.

As illustrated in FIG. 15, in one embodiment, the first clock lines 551 and the second clock lines 571 may be connected by using at least two through holes. In some other embodiments, the first clock lines 551 and the second clock lines 571 may be connected by direct contacts. The present disclosure has no limit on the connection of the first clock lines 551 and the second clock lines 571 which can be configured according to actual needs.

Figure 16:
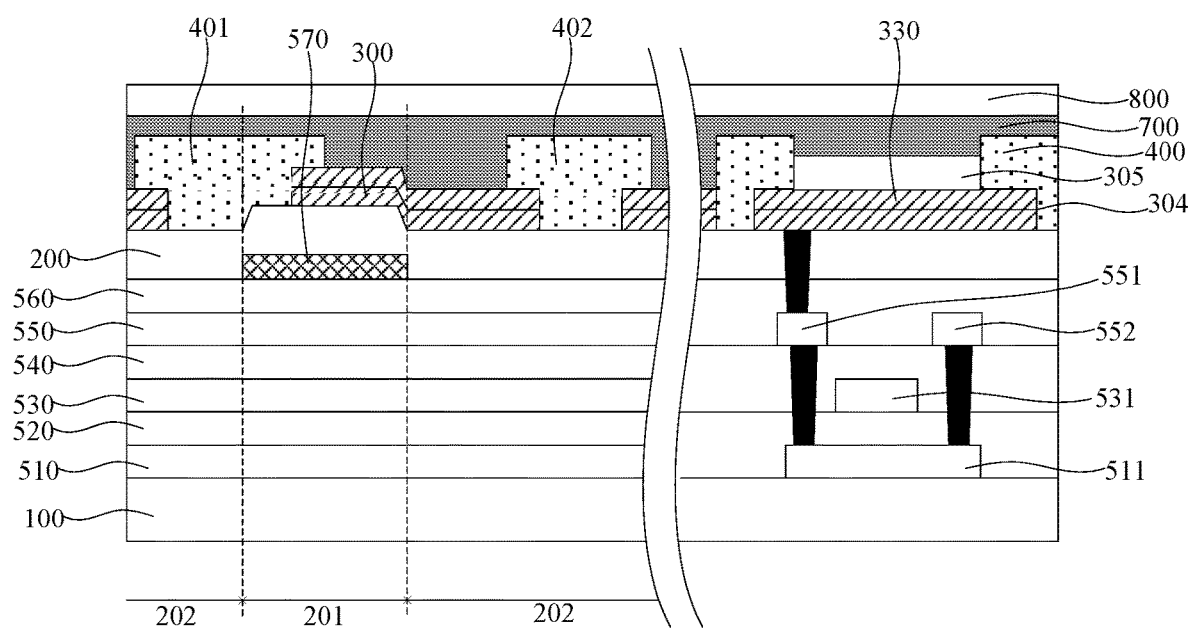
FIG. 16 illustrates another exemplary display panel consistent with various disclosed embodiments in the present disclosure.

In one embodiment illustrated in FIG. 16 showing another exemplary display panel, the anode layer 300 may include a plurality of sub anode layers 330 configured in a multilayer stacking structure along the direction perpendicular to the plane of the base substrate 100.

In the present disclosure, the anode layer may be configured to be a multilayer stacking structure including the plurality of sub anode layers. Correspondingly, parameters including materials or thickness of different sub anode layers of the plurality of sub anode layers may be optimized in design, to optimize performance of the anode layer.

Figure 17:
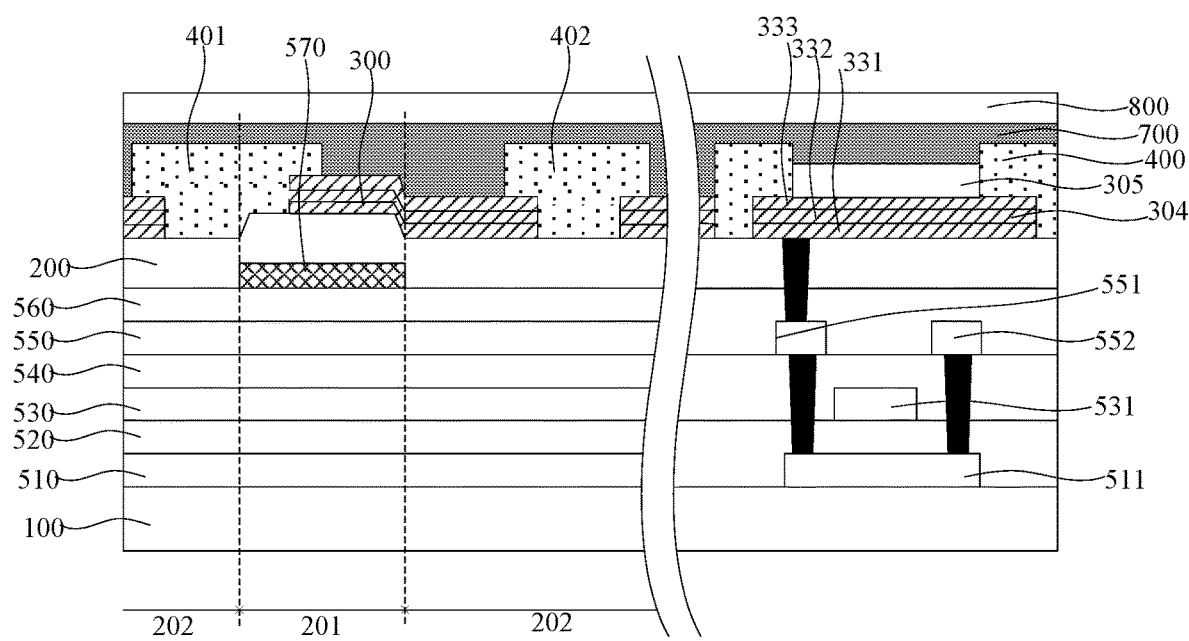
FIG. 17 illustrates another exemplary display panel consistent with various disclosed embodiments in the present disclosure.

In one embodiment, as illustrated in FIG. 17, the plurality of sub anode layers of the anode layer 300 may include a first sub anode layer 331, a second sub anode layer 332, and a third sub anode layer 333, disposed sequentially along a direction from the base substrate 100 to the anode layer 300. The first sub anode layer 331 and the third sub anode layer 333 may be transparent conductive oxide layers, while the second sub anode layer 332 may be a metal sub layer. The plurality of first covering parts 401 may cover the metal sub layer of the anode layer 300 close to the side edges of the plurality of first hollowed regions.

In the present disclosure, the anode layer may be configured to be a stacking structure including a first transparent conductive oxide layer, a metal sub layer, and a second transparent conductive oxide layer. The transparent conductive oxide layers may protect the metal sub layer from being oxidized, to optimize the performance of the anode layer. Further, the plurality of first covering parts 401 may cover the anode layer 300 close to the side edges of the plurality of first hollowed regions. That is, the plurality of first covering parts 401 may cover the metal sub layer of the anode layer 300 close to the side edges of the plurality of first hollowed regions. The metal layer may be further prevented from being exposed and oxidized. Correspondingly, the metal layer may be prevented from falling off.

In one embodiment, the transparent conductive oxide layers may be InSnOx (ITO) layers, and the metal sub layer may be a silver layer. This embodiment is used as an example to illustrate the present disclosure, and should not limit the scopes of the present disclosure. In various embodiments, the transparent conductive oxide layers and the metal sub layer may be made of any suitable materials and the present disclosure has no limit on this.

The present disclosure also provides a display device. The display device may include any display panel provided by various embodiments of the present disclosure.

Figure 18:
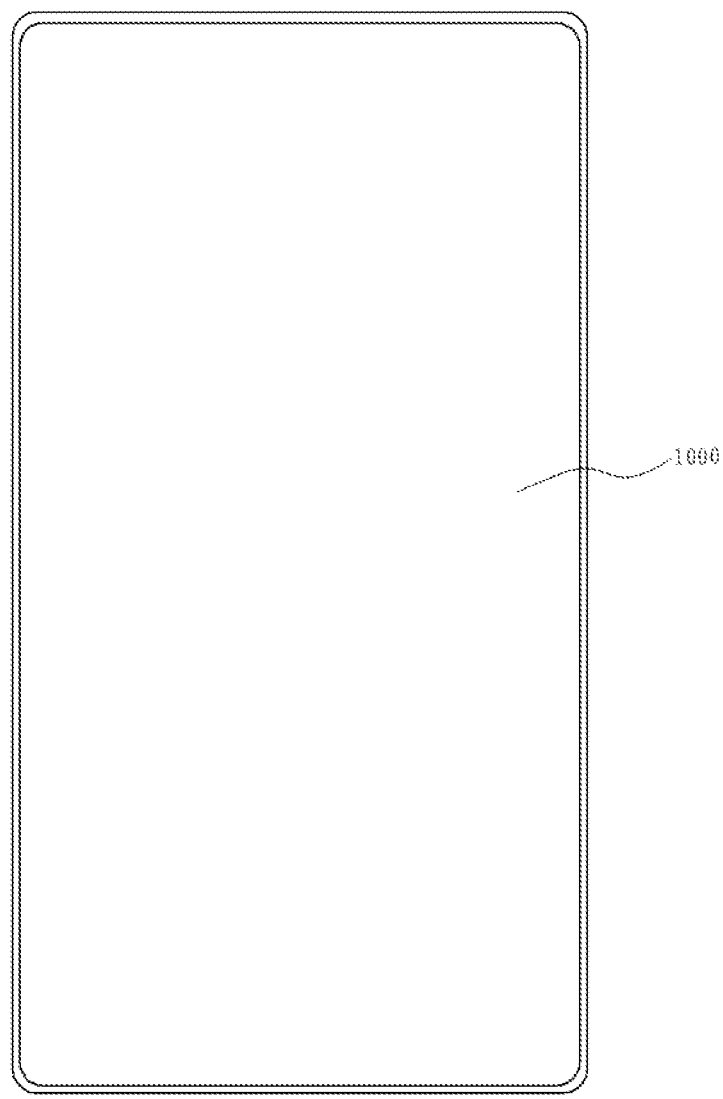
FIG. 18 illustrates an exemplary display device consistent with various disclosed embodiments in the present disclosure.

In one embodiment illustrated in FIG. 18 showing an exemplary display device, the display device 1000 may be a mobile terminal.

For description purposes only, the embodiment in FIG. 18 where the display device 1000 is a mobile terminal is used as an example to illustrate the present disclosure, and should not limit the scopes of the present disclosure. In various embodiments, the display device may be a notebook, a tablet, a computer, a wearable device, etc. The present disclosure has no limit on this.

In the present disclosure, in the display panel and the display device, the anode layer may include the plurality of first hollowed regions and the plurality of second hollowed regions. Along the direction perpendicular to the plane of the base substrate, the plurality of first hollowed regions may at least partially overlap the first region, and the plurality of second hollowed regions may at least partially overlap the second region. The pixel defining layer may include the plurality of first covering parts and the plurality of second covering parts which are discrete from each other. The plurality of first covering parts may cover the plurality of first hollowed regions and may extend to cover the edges of the anode layer at the plurality of first hollowed regions. The plurality of second covering parts may cover the plurality of second hollowed regions and may extend to cover the edges of the anode layer at the plurality of second hollowed regions. The area of orthographic projections of the plurality of first covering parts on the base substrate may be larger than the area of orthographic projections of the plurality of second covering parts on the base substrate.

In the present disclosure, the plurality of first hollowed regions of the anode layer may at least partially overlap the first region located at a relatively high position of the planarization layer, and the plurality of first hollowed regions of the anode layer may be prone to be over etched when etching. The size of the plurality of first covering parts may be configured to be larger than the size of the plurality of second covering parts, to ensure that the plurality of first covering parts can cover the plurality of first hollowed regions that is over etched and can cover the edges of the anode layer at the plurality of first hollowed regions. Correspondingly, the plurality of first hollowed regions and the plurality of second hollowed regions of the anode layer may be guaranteed to be covered by corresponding covering parts. The edge lines of the anode layer may be prevented from being exposed at the plurality of first hollowed regions and the plurality of second hollowed regions.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel, comprising a display region and a frame region surrounding the display region, wherein in the frame region, the display panel includes:
   a base substrate;
   a planarization layer at a side of the base substrate, wherein:
      the planarization layer includes a first region and a second region;
      in the first region, a perpendicular distance from an upper surface of the planarization layer to an upper surface of the base substrate is a first distance;
      in the second region, a perpendicular distance from an upper surface of the planarization layer to an upper surface of the base substrate is a second distance; and
      the first distance is greater than the second distance,
   an anode layer at a side of the planarization layer away from the base substrate, wherein:
      the anode layer includes a plurality of first hollowed regions and a plurality of second hollowed regions; and
      along a direction perpendicular to a plane of the base substrate, the plurality of first hollowed regions at least partially overlaps the first region, and the plurality of second hollowed regions at least partially overlaps the second region,
   and
   a pixel defining layer at a side of the anode layer away from the base substrate, wherein:
      the pixel defining layer includes a plurality of first covering parts and a plurality of second covering parts discrete from each other;
      the plurality of first covering parts covers the plurality of first hollowed regions and extends to further cover edges of the anode layer at the plurality of first hollowed regions;
      the plurality of second covering parts covers the plurality of second hollowed regions and extends to further cover edges of the anode layer at the plurality of second hollowed regions; and
      an area of orthographic projections of the plurality of first covering parts on the base substrate is larger than an area of orthographic projections of the plurality of second covering parts on the base substrate.

2. The display panel according to claim 1, wherein:
   an edge covering width that the plurality of first covering parts covers the anode layer is a1;
   an edge covering width that the plurality of second covering parts covers the anode layer is a2; and
   a1≥a2.

3. The display panel according to claim 2, wherein 0≤a1−a2≤3 μm.

4. The display panel according to claim 1, wherein:
   an edge region of the anode layer close to one of the plurality of first hollowed regions and covered by a corresponding one of the plurality of first covering parts includes a first edge region and a second edge region;
   along the direction perpendicular to the plane of the base substrate, the first edge region overlaps the first region and the second edge region overlaps the second region; and
   a width of the first edge region is larger than a width of the second edge region.

5. The display panel according to claim 1, wherein an edge covering width that the plurality of first covering parts covers the anode layer is a1, wherein 1 μm≤a1≤5 μm.

6. The display panel according to claim 1, wherein:
   the first region includes a first side edge and a second side edge opposite to each other along a first direction; and
   along the direction perpendicular to the plane of the base substrate, orthographic projections of the plurality of first hollowed regions completely cover the first side edge and the second side edge.

7. The display panel according to claim 1, wherein an area of the plurality of first hollowed regions is larger than an area of the plurality of second hollowed regions.

8. The display panel according to claim 1, further including an array layer between the base substrate and the planarization layer, wherein the array layer includes:
   a semiconductor layer on the base substrate;
   a gate insulating layer on a side of the semiconductor layer away from the base substrate;
   a first metal layer on a side of the gate insulating layer away from the base substrate;
   an interlayer dielectric layer on a side of the first metal layer away from the base substrate;
   a second metal layer on a side of the interlayer dielectric layer away from the base substrate;
   a passivation layer on a side of the second metal layer away from the base substrate; and
   a third metal layer on a side of the passivation layer away from the base substrate, wherein the second metal layer overlaps the third metal layer in the first region.

9. The display panel according to claim 8, wherein:
   the frame region includes a driving circuit disposed in the array layer;
   the driving circuit includes a plurality of driving signal lines; and along the direction perpendicular to the plane of the base substrate, a thickness of the plurality of driving signal lines in the first region is larger than a thickness of the plurality of driving signal lines in the second region.

10. The display panel according to claim 8, wherein:
the frame region includes clock signal lines in the first region;
the clock signal lines include a first sub clock signal line disposed in the second metal layer and a second sub clock signal line in the third metal layer; and
the first sub clock signal line and the second sub clock signal line are configured in parallel.

11. The display panel according to claim 10, wherein:
the first sub clock signal line and the second sub clock signal line are electrically connected to each other by a direct contact.

12. The display panel according to claim 10, wherein:
the first sub clock signal line and the second sub clock signal line are electrically connected to each other through at least two through holes.

13. The display panel according to claim 1, wherein:
the anode layer includes a plurality of sub anode layers configured in a multilayer stacking structure along the direction perpendicular to the plane of the base substrate.

14. The display panel according to claim 13, wherein:
the plurality of sub anode layers includes a first sub anode layer, a second sub anode layer, and a third sub anode layer disposed sequentially along a direction from the base substrate to the anode layer;
the first sub anode layer and the third sub anode layer are transparent conductive oxide layers;
the second sub anode layer is a metal sub layer; and
the plurality of first covering parts covers the metal sub layer of the anode layer close to the side edges of the plurality of first hollowed regions.

15. The driving panel according to claim 14, wherein:
the transparent conductive oxide layers include indium doped tin oxide (ITO) layers; and
the metal sub layer includes a silver layer.

16. A display device, comprising a display panel, wherein:
the display panel includes a display region and a frame region surrounding the display region; and
in the frame region, the display panel includes:

a base substrate;
a planarization layer at a side of the base substrate, wherein:
the planarization layer includes a first region and a second region;
in the first region, a perpendicular distance from an upper surface of the planarization layer to an upper surface of the base substrate is a first distance;
in the second region, a perpendicular distance from an upper surface of the planarization layer to an upper surface of the base substrate is a second distance; and
the first distance is larger than the second distance,
an anode layer at a side of the planarization layer away from the base substrate, wherein:
the anode layer includes a plurality of first hollowed regions and a plurality of second hollowed regions; and
along a direction perpendicular to a plane of the base substrate, the plurality of first hollowed regions at least partially overlaps the first region, and the plurality of second hollowed regions at least partially overlaps the second region,
and
a pixel defining layer at a side of the anode layer away from the base substrate, wherein:
the pixel defining layer includes a plurality of first covering parts and a plurality of second covering parts which are discrete from each other;
the plurality of first covering parts covers the plurality of first hollowed regions and extends to further cover edges of the anode layer at the plurality of first hollowed regions;
the plurality of second covering parts covers the plurality of second hollowed regions and extends to further cover edges of the anode layer at the plurality of second hollowed regions; and
an area of orthographic projections of the plurality of first covering parts on the base substrate is larger than an area of orthographic projections of the plurality of second covering parts on the base substrate.

* * * * *